United States Patent
Oh et al.

(10) Patent No.: US 10,908,842 B2
(45) Date of Patent: Feb. 2, 2021

(54) STORAGE DEVICE INCLUDING WRITE BUFFER MEMORY AND METHOD OF OPERATING STORAGE DEVICE

(71) Applicant: Samsung Electronics Co., Ltd., Suwon-si (KR)

(72) Inventors: Eun Chu Oh, Hwaseong-si (KR); Younggeun Lee, Seoul (KR); Youngjin Cho, Seoul (KR); Jin-Hyeok Choi, Yongin-si (KR)

(73) Assignee: Samsung Electronics Co., Ltd.

( * ) Notice: Subject to any disclaimer, the term of this patent is extended or adjusted under 35 U.S.C. 154(b) by 69 days.

(21) Appl. No.: 16/422,599

(22) Filed: May 24, 2019

(65) Prior Publication Data

US 2019/0369921 A1 Dec. 5, 2019

(30) Foreign Application Priority Data

May 29, 2018 (KR) .......................... 10-2018-0061134

(51) Int. Cl.
*G06F 3/06* (2006.01)
*G11C 11/56* (2006.01)
(Continued)

(52) U.S. Cl.
CPC .......... *G06F 3/0659* (2013.01); *G06F 3/0604* (2013.01); *G06F 3/068* (2013.01); *G06F 3/0656* (2013.01); *G06F 11/1068* (2013.01); *G11C 11/5678* (2013.01); *G11C 13/0004* (2013.01); *G11C 13/0069* (2013.01);
(Continued)

(58) Field of Classification Search
CPC .... G06F 3/0659; G06F 3/0604; G06F 3/0656; G06F 3/068; G06F 11/1068; G11C 11/5678; G11C 13/0004; G11C 13/0069; G11C 16/0483; G11C 29/52; G11C 2213/72; G11C 2213/79; H03M 13/2906
USPC ............... 714/755, 763, 768, 769, 773, 799; 365/200, 201, 185.09
See application file for complete search history.

(56) References Cited

U.S. PATENT DOCUMENTS 8,898,374 B2 11/2014 Yang
8,976,587 B2 3/2015 Yoon et al.
(Continued)

OTHER PUBLICATIONS

Kang et al. "Performance Trade-Offs in Using NVRAM Write Buffer for Flash Memory-Based Storage Devices" IEEE Transaction on Computers 28(6):744-758 (2009)

*Primary Examiner* — John J Tabone, Jr.
(74) *Attorney, Agent, or Firm* — Myers Bigel, P.A.

(57) ABSTRACT

A storage device includes a nonvolatile memory including a plurality of nonvolatile memory cells, a write buffer memory storing first data and second data received from a host, and a storage controller storing the first data and the second data that are stored in the write buffer memory into the nonvolatile memory. The storage controller performs a first program operation and a second program operation on a plurality of first memory cells connected to a first word line group to store the first data, and performs a first program operation and a second program operation on a plurality of second memory cells connected to a second word line group to store the second data. While the storage controller performs the first program operation on the plurality of second memory cells, the first data is written in the write buffer memory.

20 Claims, 15 Drawing Sheets

(51) Int. Cl.
*G06F 11/10* (2006.01)
*G11C 29/52* (2006.01)
*G11C 13/00* (2006.01)
*G11C 16/04* (2006.01)
*H03M 13/29* (2006.01)

(52) U.S. Cl.
CPC .......... *G11C 16/0483* (2013.01); *G11C 29/52* (2013.01); *H03M 13/2906* (2013.01); *G11C 2213/72* (2013.01); *G11C 2213/79* (2013.01)

(56) References Cited

U.S. PATENT DOCUMENTS

| | | | |
|---|---|---|---|
| 9,025,376 B2 * | 5/2015 | Ryu | G11C 11/5628 365/185.03 |
| 9,466,390 B2 * | 10/2016 | Kim | G11C 16/3404 |
| 9,529,668 B2 | 12/2016 | Wakchaure et al. | |
| 9,824,761 B2 | 11/2017 | Kwak et al. | |
| 9,870,169 B2 | 1/2018 | Ramalingam et al. | |
| 10,032,519 B2 * | 7/2018 | Kato | G11C 16/10 |
| 10,121,543 B2 * | 11/2018 | Oh | G11C 16/10 |
| 2008/0031050 A1 * | 2/2008 | Yoon | G11C 7/1096 365/185.18 |
| 2008/0279009 A1 * | 11/2008 | Park | G11C 16/10 365/185.18 |
| 2011/0249496 A1 * | 10/2011 | Son | G11C 16/3436 365/185.03 |
| 2012/0002470 A1 * | 1/2012 | Futatsuyama | G11C 16/3418 365/185.03 |
| 2013/0064029 A1 * | 3/2013 | Park | G11C 7/12 365/203 |
| 2013/0155772 A1 * | 6/2013 | Leem | G11C 16/12 365/185.11 |
| 2013/0326125 A1 * | 12/2013 | Chang | G06F 12/0246 711/103 |
| 2014/0115225 A1 | 4/2014 | Chandrakar et al. | |
| 2015/0029789 A1 * | 1/2015 | Seol | G11C 16/26 365/185.03 |
| 2016/0035427 A1 * | 2/2016 | Yu | G11C 16/3418 365/185.12 |
| 2017/0236588 A1 | 8/2017 | Kim et al. | |
| 2018/0260347 A1 * | 9/2018 | Benisty | G06F 3/0688 |
| 2019/0088340 A1 * | 3/2019 | Shirakawa | G11C 7/06 |
| 2019/0115070 A1 * | 4/2019 | Harada | G11C 11/5628 |
| 2019/0156909 A1 * | 5/2019 | Lee | G11C 29/72 |
| 2019/0317691 A1 * | 10/2019 | Kanno | G06F 3/0659 |

* cited by examiner

STORAGE DEVICE INCLUDING WRITE BUFFER MEMORY AND METHOD OF OPERATING STORAGE DEVICE

CROSS-REFERENCE TO RELATED APPLICATION

This non-provisional application claims priority under 35 U.S.C. § 119 to Korean Patent Application No. 10-2018-0061134, filed on May 29, 2018, in the Korean Intellectual Property Office, the disclosure of which is incorporated herein in its entirety by reference.

BACKGROUND

The inventive concept relates to a semiconductor device, and more particularly, to a storage device including a nonvolatile memory and a method of operating the storage device.

Flash memories, as nonvolatile memories, may retain data stored therein even when power is turned off. Recently, storage devices including flash memories such as solid state drives (SSDs) and memory cards are widely used and are useful for storing or moving a large amount of data.

SUMMARY

The inventive concept provides a storage device for efficiently executing a plurality of program operations by including a large-capacity write buffer memory, and a method of operating the storage device.

According to some embodiments of the inventive concept, there is provided a storage device including a nonvolatile memory including a plurality of nonvolatile memory cells, a write buffer memory configured to store first data and second data received from a host, and a storage controller configured to store the first data and the second data stored in the write buffer memory into the nonvolatile memory. The storage controller is configured to perform a first program operation and a second program operation on a plurality of first memory cells connected to a first word line group including a plurality of first word lines to store the first data, and perform a first program operation and a second program operation on a plurality of second memory cells connected to a second word line group including a plurality of second word lines to store the second data. While the storage controller is configured to perform the first program operation on the plurality of second memory cells, the first data is written in the write buffer memory.

According to some embodiments of the inventive concept, there is provided a storage device including a nonvolatile memory including a plurality of nonvolatile memory cells, and a storage controller configured to store first data and second data received from a host into the nonvolatile memory, the storage controller including a write buffer memory. The storage controller is configured to perform a first program operation and a second program operation on a plurality of first memory cells connected to a first word line group to store the first data, and perform a first program operation and a second program operation on a plurality of second memory cells connected to a second word line group to store the second data. The first data is written in the write buffer memory while the storage controller is configured to perform the first program operation on the plurality of second memory cells.

According to some embodiments of the inventive concept, there is provided a method of operating a storage device including a nonvolatile memory and a storage controller configured to control the nonvolatile memory, the method of operating the storage device including performing a first program operation on a plurality of first memory cells connected to a first word line group based on a first data, performing a first program operation on a plurality of second memory cells connected to a second word line group different from the first word line group based on a second data, performing a second programming operation on the plurality of first memory cells based on the first data, and performing a second program operation on the plurality of second memory cells based on the second data. Ones of the plurality of first memory cells and ones of the plurality of second memory cells stores multi-bit data, the performing of the first programming operation on the plurality of first memory cells, the performing of the first programming operation on the plurality of second memory cells, the performing of the second programming operation on the plurality of first memory cells, and the performing of the second programming operation on the plurality of second memory cells are sequentially executed.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the inventive concept are described in detail with reference to the accompanying drawings.

Figure 1A:
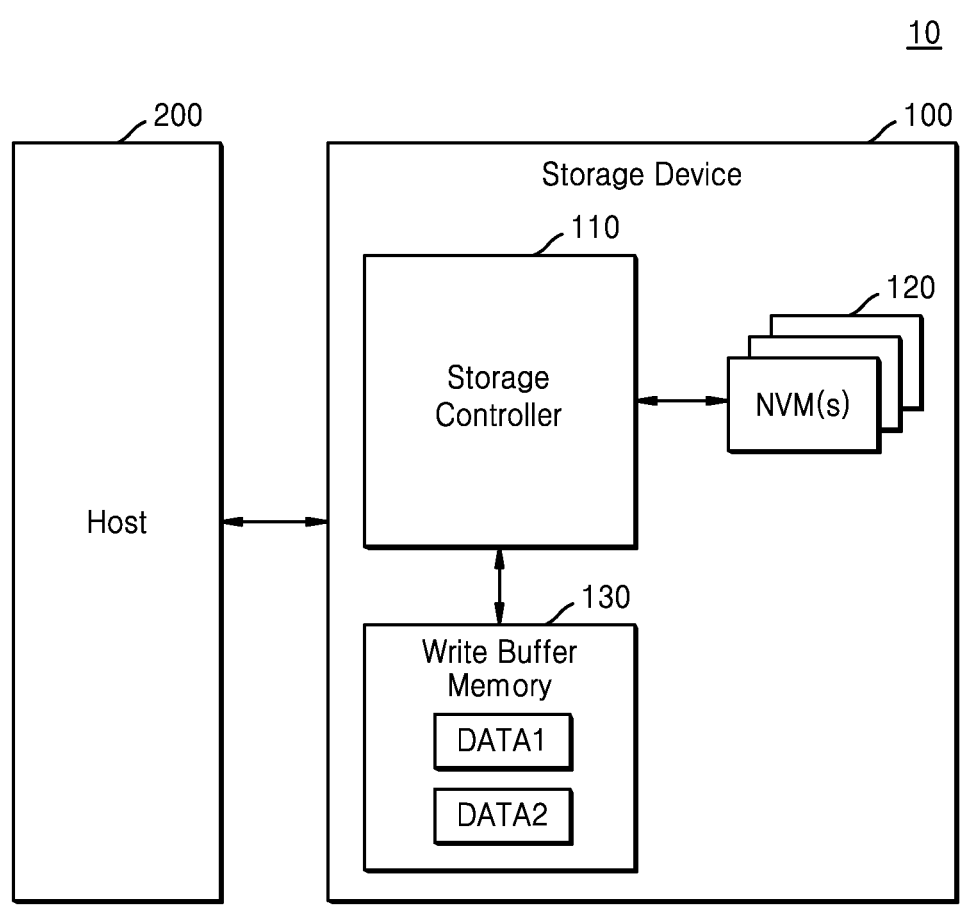
FIG. 1A is a block diagram illustrating a storage system according to some embodiments of the present inventive concept.

FIG. 1A is a block diagram illustrating a storage system 10 according to some embodiments. The storage system 10 may be implemented as, for example, a personal computer (PC), a laptop computer, a mobile phone, a smart phone, a tablet PC, a personal digital assistant (PDA), an enterprise digital assistant (EDA), a video still camera, a digital video camera, an audio device, a portable multimedia player (PMP), a personal navigation device (PND), an MP3 player, a handheld game console, or an e-book. In addition, the storage system 10 may be implemented as, for example, an electronic device such as a wearable device such as a wristwatch or a head-mounted display (HMD).

Referring to FIG. 1A, the storage system 10 may include a storage device 100 and a host 200. The storage device 100 may include a storage controller 110 and a nonvolatile memory (NVM) 120. The storage device 100 illustrated in FIG. 1A according to the inventive concept may further include a write buffer memory 130.

The host 200 may provide an access request of data to the storage device 100. In some embodiments, the host 200 provides a write request or a read request of data to the storage device 100, and the storage device 100 may write data into the NVM 120 in response to the access request from the host 200, or may read data from the NVM 120 and provide the read data to the host 200. In addition, the storage device 100 may perform an erase operation on data in an area directed by the host 200 in response to an erase request of data from the host 200.

The host 200 may communicate with the storage device 100 via various interfaces. The host 200 may include various types of devices capable of performing data access to the storage device 100. For example, the host 200 may be an application processor (AP) that communicates with the flash memory-based storage device 100. The host 200 may communicate with the storage device 100 via various interfaces.

The NVM 120 may include a memory cell array including a plurality of memory cells. For example, the plurality of memory cells may be flash memory cells. Below, embodiments will be described for the case in which the plurality of memory cells are NAND flash memory cells. However, the technical idea of the inventive concept is not limited thereto, and the plurality of memory cells may be various kinds of NVM cells. In some embodiments, the plurality of memory cells may be resistance-based memory cells such as resistance random access memory (RAM) (RRAM), phase change RAM (PRAM), and magnetic RAM (MRAM). In some embodiments, the plurality of memory cells may be ferroelectric RAM (FRAM) cells, spin transfer torque RAM (STT-RAM) cells, or the like.

The NVM 120 may be implemented in a three-dimensional array structure. The inventive concept may be applicable not only to a flash memory device in which a charge storage layer includes a conductive floating gate but also to a charge trap flash (CTF) in which the charge storage layer includes an insulating film.

The storage controller 110 may control the NVM 120 to write data into the NVM 120 in response to the write request received from the host 200. At this time, in the NVM 120, a plurality of program operations may be performed for a plurality of word lines so that data is written, and each of the plurality of program operations may be performed by an incremental step pulse programming (ISPP) method. In some embodiments, the plurality of program operations may include at least one coarse program operation and at least one fine program operation.

The plurality of program operations may include a first program operation and a second program operation that are sequentially performed. In the first program operation and the second program operation, increments of program pulses in the first program operation and increments of program pulses in the second program operation may be different. Time intervals between the program pulses in the first program operation and time intervals between the program pulses in the second program operation may be different. In the storage device 100 according to the inventive concept, a threshold voltage dispersion width may be narrowly formed by performing the plurality of program operations to the plurality of word lines. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

While the plurality of program operations are being performed, data to be written into the plurality of memory cells may be stored in the write buffer memory 130. For example, data to be written into the plurality of memory cells connected to the plurality of word lines may be simultaneously stored in the write buffer memory 130.

In some embodiments, the write buffer memory 130 may be the resistance-based memory such as RRAM, PRAM, and MRAM. In some embodiments, the write buffer memory 130 may be FRAM, STT-RAM, or the like. In some embodiments, the write buffer memory 130 may be a NAND flash memory including a single level cell (SLC). In some embodiments, the write buffer memory 130 may be a memory of a different type from the NVM 120.

When a delay time between a time when the first program operation is completed and a time when the second program operation begins is not sufficiently secured, the threshold voltage distributions between different program states may overlap. The storage device 100 according to the inventive concept may secure the delay time by performing a program operation on a plurality of different word lines between an execution of the first program operation and an execution of the second program operation. The threshold voltage distributions according to the first program operation and the second program operation will be described later with reference to FIG. 4.

The write buffer memory 130 may store first data DATA1 to be written into first memory cells during a delay time in which the second program operation starts after the first program operation for a plurality of first memory cells connected to a first word line group is completed. The write buffer memory 130 may store second data DATA2 to be written into second memory cells so that the first program operation is performed on a plurality of second memory cells connected to a second word line group during the delay time. The first word line group and the second word line group may each include the plurality of word lines.

In other words, the write buffer memory 130 may have a capacity to simultaneously store the first data DATA1 and the second data DATA2. When storing of the first data DATA1 into the plurality of first memory cells is completed, the first data DATA1 in the write buffer memory 130 may be erased.

In some embodiments, the storage device 100 may be an internal memory embedded in an electronic device. For example, the storage device 100 may be an embedded universal flash storage (UFS) memory device, an embedded multi-media card (eMMC), or a solid state drive (SSD). The storage device 100 and the host 200 may be mounted on the same substrate. In some embodiments, the storage device 100 may be an external memory removable from the electronic device. For example, the storage device 100 may include at least one of a UFS memory card, a compact flash (CF) memory card, a secure digital (SD) card, a micro-SD card, a mini SD card, an extreme digital (xD) card, and a memory stick.

Figure 1B:
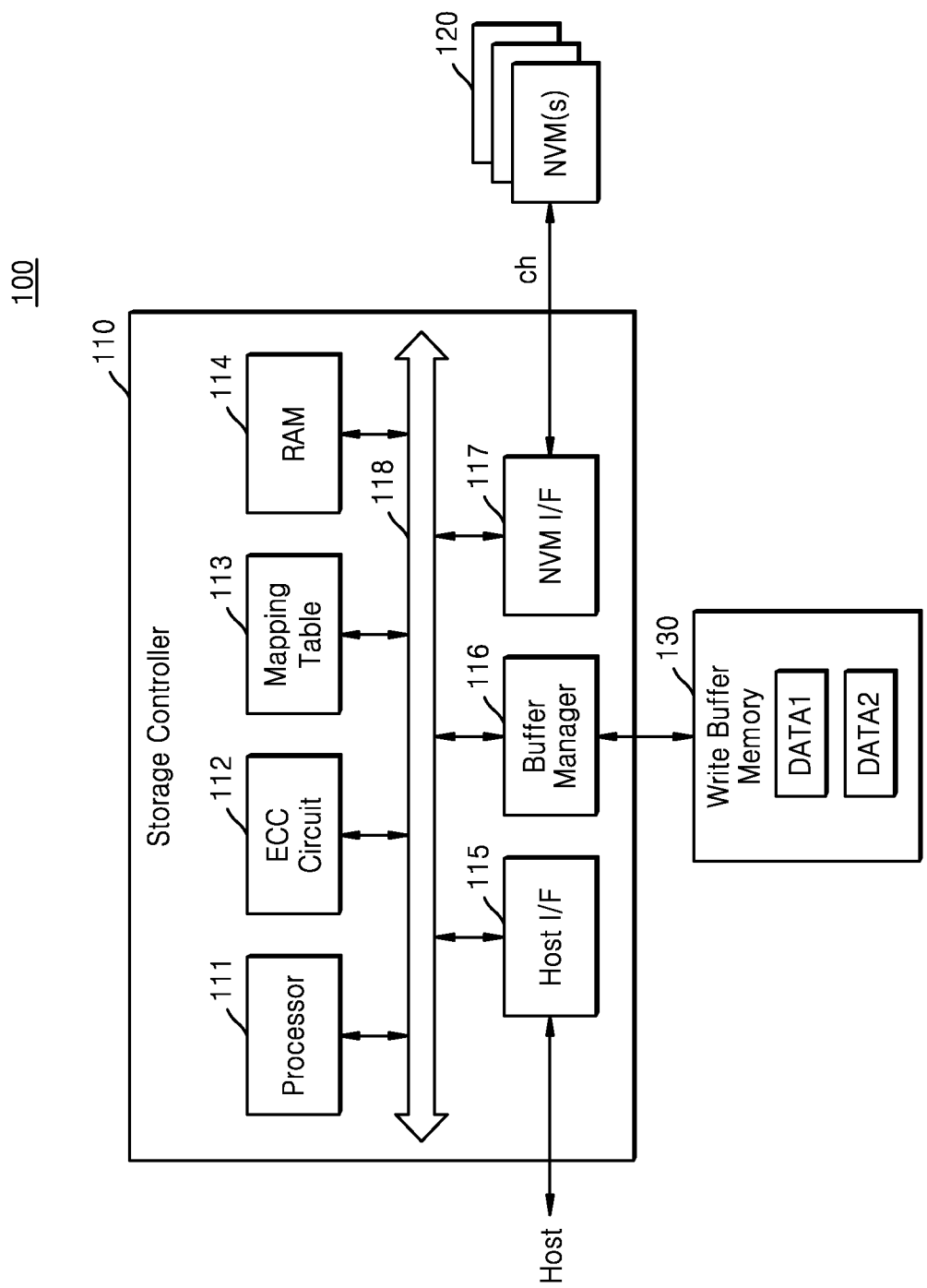
FIG. 1B is a block diagram illustrating a storage device according to some embodiments of the present inventive concept.

FIG. 1B is a block diagram illustrating the storage device 100 according to some embodiments.

Referring to FIG. 1B, the storage device 100 may include the storage controller 110, the NVM 120, and the write buffer memory 130. The storage controller 110 may include a processor 111, an error checking and correcting (ECC) circuit 112, a mapping table 113, RAM 114, a host interface (I/F) 115, a buffer manager 116, and an NVM I/F 117, which are capable of communicating with each other via a bus 118. In addition, the storage controller 110 may further include other peripheral devices.

The processor 111 may control an overall operation of the storage controller 110. The processor 111 may further include a central processing unit, a microprocessor, or the like. The processor 111 may drive firmware to drive the storage controller 110. The firmware may be loaded into the RAM 114 and be driven, and may include a flash translation layer (FTL).

The mapping table 113 may map and store physical address information of a page of the write buffer memory 130 corresponding to a logical address of each page of the NVM 120. The mapped physical address information may be updated each time data received from the host 200 is stored into the write buffer memory 130. Although the mapping table 113 is separately illustrated in FIG. 1B, the mapping table 113 may be implemented in the RAM 114 according to some embodiments.

The RAM 114 may operate under a control of the processor 111 and may be used as a working memory, a buffer memory, a cache memory, or the like. Software and firmware for controlling the storage controller 110 may be loaded into the RAM 114. The RAM 114 may be implemented as a volatile memory such as dynamic RAM (DRAM) and static RAM (SRAM). In some embodiments, the RAM 114 may be implemented as the resistance-based memory such as RRAM, PRAM, or MRAM.

The host I/F 115 may provide an interface between the host 200 and the storage controller 110. The host 200 and the storage controller 110 may be connected to each other via at least one of various standard interfaces. The standard interfaces may include various interfaces such as universal serial bus (USB), embedded multi-media card (eMMC), multi-media card (MMC), PCI express (PCI-E), advance technology attachment (ATA), serial ATA (SATA), external SATA (e-SATA), parallel ATA (PATA), small computer system interface (SCSI), serial attached SCSI (SAS), enhanced small disk interface (ESDI), integrated drive electronics (IDE), IEEE 1394, and/or a card interface.

The buffer manager 116 may provide an interface between the storage controller 110 and the write buffer memory 130. Data to be written into the NVM 120 may be temporarily stored in the write buffer memory 130 via the buffer manager 116.

The NVM I/F 117 may provide an interface between the storage controller 110 and the NVM 120. For example, the storage controller 110 may send and receive data to and from the NVM 120 via the NVM I/F 117.

The NVM 120 may store data or read stored data under a control of the storage controller 110. The NVM 120 may include a plurality of NVM chips including the memory cell array and may be connected to the NVM I/F 117 via a plurality of channels Ch. The NVM 120 may include a three-dimensional memory cell array in which memory cell strings to which the memory cells are connected are formed perpendicular to a substrate. However, the embodiment is not limited thereto and may include a planar type memory cell array.

Figure 2:
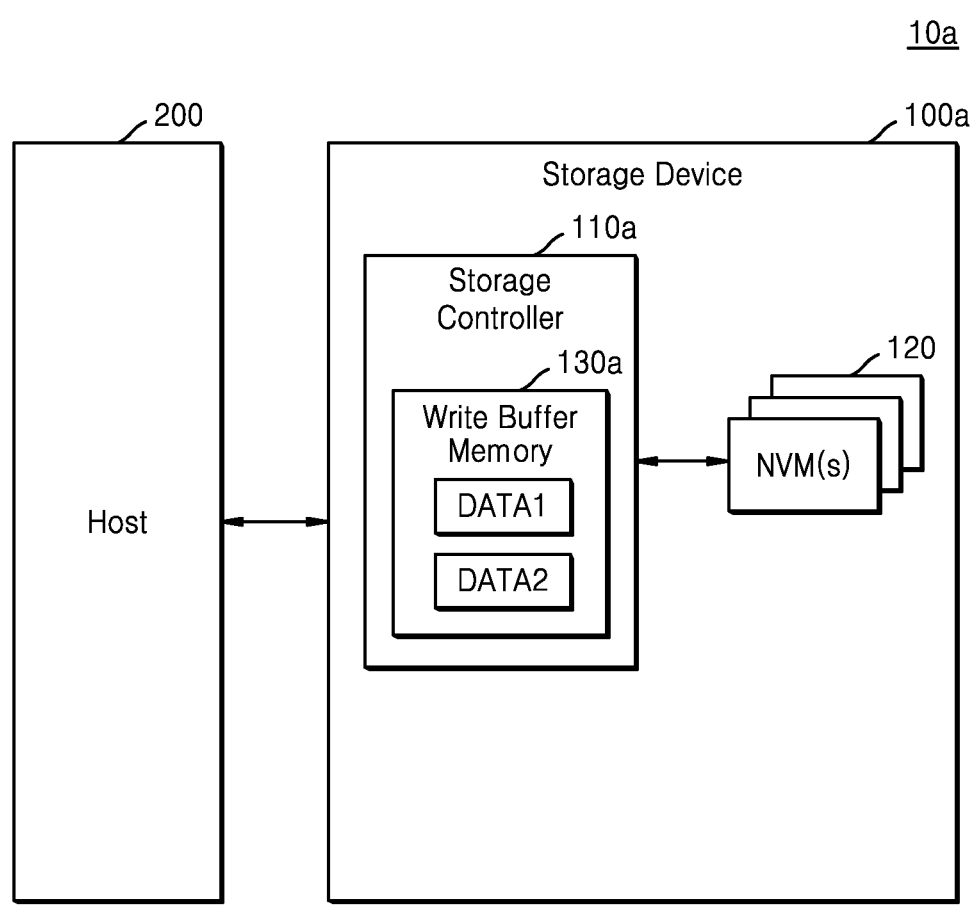
FIG. 2 is a block diagram illustrating a storage system according to some embodiments of the present inventive concept.

FIG. 2 is a block diagram illustrating a storage system 10a according to some embodiments.

Referring to FIG. 2, the storage system 10a may include a storage device 100a and the host 200. The storage device 100a may include a storage controller 110a and the NVM 120. The storage device 100 in FIG. 1 includes the write buffer memory 130 separate from the storage controller 110, but the storage device 100a in FIG. 2 may include a write buffer memory 130a embedded therein.

The storage controller 110a may include a buffer manager and data to be written into the NVM 120 may be temporarily stored in the write buffer memory 130a via the buffer manager.

Accordingly, the write buffer memory 130a may store the first data DATA1 to be written into first memory cells during a delay time in which the second program operation starts after the first program operation for a plurality of first memory cells connected to a first word line group is completed. In addition, the write buffer memory 130a may store the second data DATA2 to be written into second memory cells so that the first program operation is performed on a plurality of second memory cells connected to a second word line group during the delay time. Accordingly, the write buffer memory 130a may have a capacity to simultaneously store the first data DATA1 and the second data DATA2.

It will be apparent that the description of the write buffer memory 130 described below may be applied to the write buffer memory 130a in FIG. 2.

Figure 3:
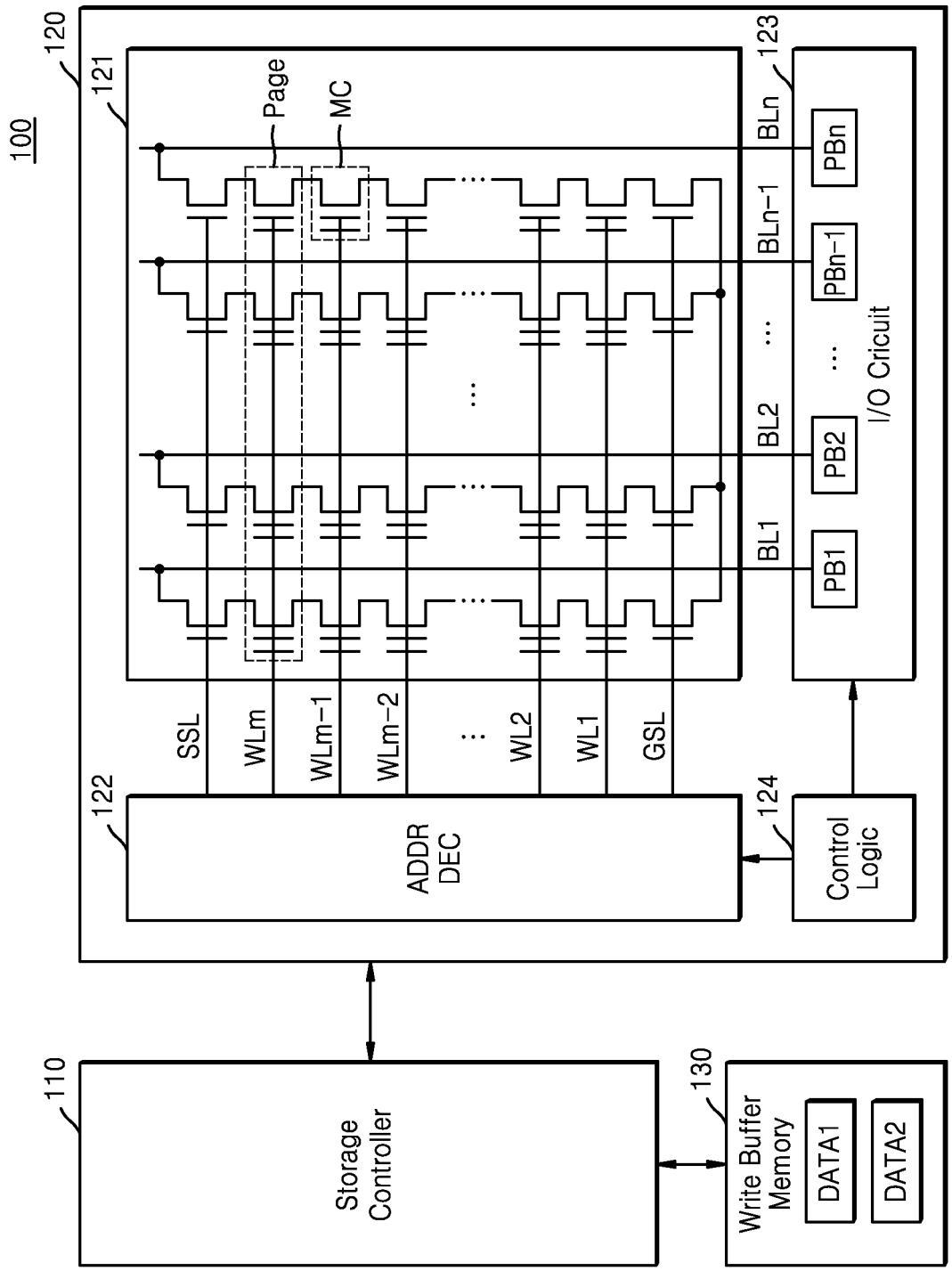
FIG. 3 is a block diagram illustrating a storage device according to some embodiments of the present inventive concept.

FIG. 3 is a block diagram illustrating the storage device 100 according to some embodiments.

Referring to FIG. 3, the storage device 100 may include the NVM 120 and the storage controller 110 for controlling the NVM 120.

The NVM 120 may include a memory cell array 121, an address decoder (ADDR DEC) 122, an input/output circuit 123, and a control logic 124. The NVM 120 may be implemented in a three-dimensional array structure. Hereinafter, the NVM 120 will be referred to as a NAND flash memory device for convenience of explanation.

The memory cell array 121 may be connected to the ADDR DEC 122 via first through $m^{th}$ word lines WL1 through WLm, at least one string selection line SSL, and at least one ground selection line GSL, and may be connected to the input/output circuit 123 via first through $n^{th}$ bit lines BL1 through BLn. The memory cell array 121 may include a plurality of memory blocks. In FIG. 3, only one memory block is illustrated for convenience of explanation. In this case, m may be an integer of 5 or more and n may be an integer of 4 or more, and accordingly, the number of first through $m^{th}$ word lines WL1 through WLm and the number of first through $n^{th}$ bit lines BL1 through BLn may be variously configured. In some embodiments, the memory block may correspond to a unit in which the erase operation is performed.

The memory block may include a plurality of strings. Here, each of the plurality of strings may include at least one string selection transistor, the plurality of memory cells MC, and at least one ground selection transistor. Each of the plurality of memory cells MC may store multi-bit data. Each of the plurality of memory cells MC may store k-bit data (k is an integer of 2 or more). For example, each of the plurality of memory cells MC may store data of 4 bits or more.

The memory block may include first through $m^{th}$ pages Page_1 through Page_m. Each of the first through $m^{th}$ pages Page_1 through Page_m may correspond to a write unit or a read unit of data in one memory block. Each of the first through $m^{th}$ pages Page_1 through Page_m may be connected to one of the first through $m^{th}$ word lines WL1 through WLm. For example, a first page Page1 may be connected to the first word line WL1, and the $m^{th}$ page Page_m may be connected to the $m^{th}$ word line WLm.

The ADDR DEC 122 may be connected to the memory cell array 121 via the first through $m^{th}$ word lines WL1 through WLm, at least one string select line SSL, and at least one ground select line GSL. The ADDR DEC 122 may select the first through $m^{th}$ word lines WL1 through WLm, the string selection line SSL, and the ground selection line GSL by using a decoded row address. In addition, the ADDR DEC 122 may decode a column address among input addresses ADDR. Here, the decoded column address may be transmitted to the input/output circuit 123. In some embodiments, the ADDR DEC 122 may include a row decoder, a column decoder, an address buffer, and the like.

The input/output circuit 123 may be connected to the memory cell array 121 via the first through $n^{th}$ bit lines BL1 through BLn. The input/output circuit 123 may be implemented to receive the decoded column address from the ADDR DEC 122. The input/output circuit 123 may select the first through $n^{th}$ bit lines BL1 through BLn by using the decoded column address ADDR.

The input/output circuit 123 may include first through $n^{th}$ page buffers PB1 through PBn respectively connected to the first through $n^{th}$ bit lines BL1 through BLn. The first through $n^{th}$ page buffers PB1 through PBn may receive data from the outside (for example, the storage controller 110) during the program operation and store the input data into the memory cell array 121. In addition, the first through nth page buffers PB1 through PBn may read data from the memory cell array 121 during a read operation and output the read data to the outside. Each of the first through $n^{th}$ page buffers PB1 through PBn may include a plurality of latches.

The control logic 124 may control an overall operation of the NVM 120 (for example, a plurality of program operations, read operations, and erase operations). The control logic 124 may operate in response to externally input control signals. The control logic 124 may control the ADDR DEC 122 and the input/output circuit 123 for performing the first program operation and the second program operation.

Figure 4:
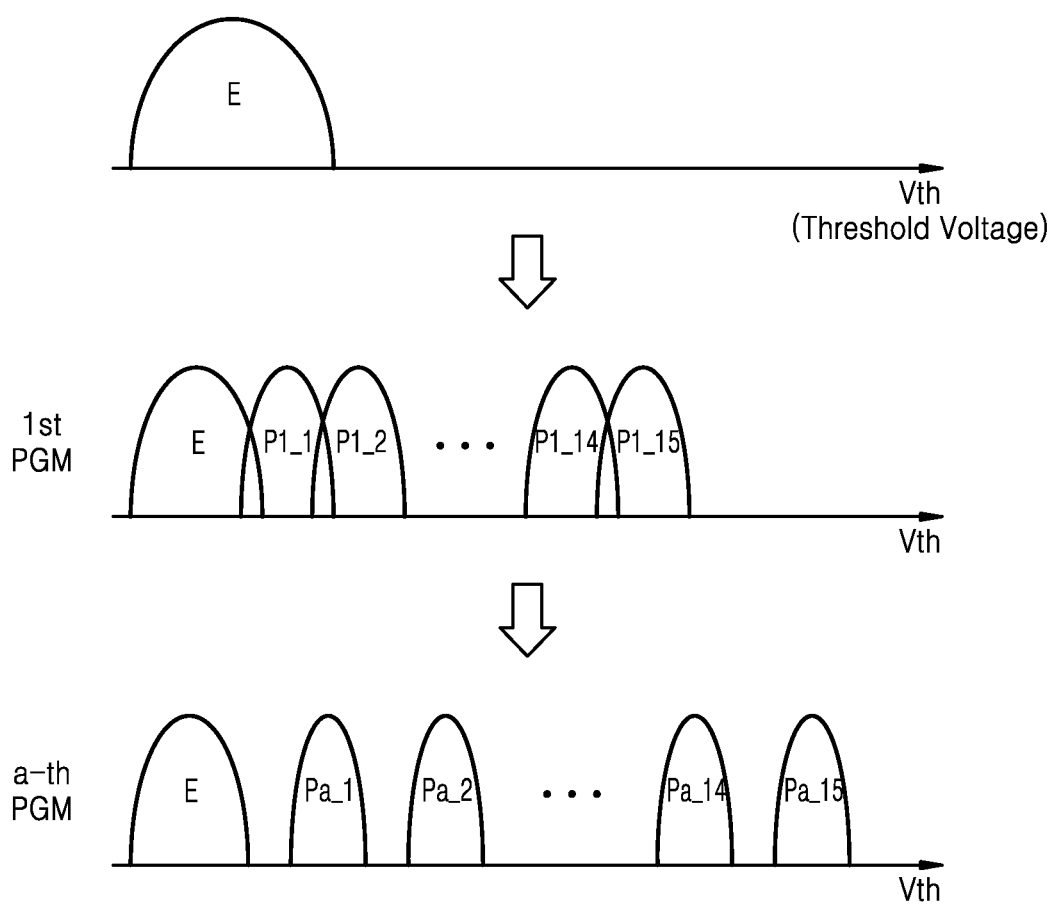
FIG. 4 is a diagram illustrating threshold voltage distributions of a memory cell programmed in a memory cell array illustrated in FIG. 3 according to some embodiments of the present inventive concept.

FIG. 4 is a diagram illustrating threshold voltage distributions of the memory cell MC programmed in the memory cell array 121 illustrated in FIG. 3. In FIG. 4, it is assumed that a 4-bit program operation is performed on the memory cell MC for convenience of explanation. Accordingly, the memory cell MC may be programmed with at least one of 16 threshold voltage distributions.

Referring to FIG. 4, the memory cell MC may be programmed with at least one of an erase state E, and program states (for example, first state through fifteenth state Pa_1 through Pa_15) by first through $a^{th}$ program operations 1st PGM through a-th PGM. Here, the program states (for example, Pa_1 through Pa_15) may be final states storing 4-bit data.

The plurality of program operations may perform the first program operation 1st PGM and then, the $a^{th}$ program operation a-th PGM. Here, a may be a natural number of 2 or more. The number of program operations may vary depending on the case.

During the first program operation 1st PGM, the threshold voltage distribution of the memory cell MC may be programmed with at least one of the erase state E and first through fifteenth program states P1_1 through P1_15. During the $a^{th}$ program operation a-th PGM, the threshold voltage distribution of the memory cell MC may be programmed with at least one of the erase state E and first through fifteenth program states Pa_1 through Pa_15. At least one distribution width of the first through fifteenth program states Pa_1 through Pa_15 of the a-th program operation a-th PGM may be narrower than a distribution width of the first through fifteenth program states P1_1 through P1_15 of the corresponding first program operation 1st PGM. The level of the threshold voltage may gradually increase from the first program state P1_1 to the fifteenth program state P1_15.

For example, "a" may be equal to 2, and after performing the first program operation 1st PGM, the second program operation 2nd PGM may be performed so that the threshold voltage distribution of the memory cell MC is programmed with at least one of the erase state E and first through fifteenth program states P2_1 through P2_15.

A storage device according to the inventive concept may perform a plurality of program operations so that a width of a threshold voltage distribution of a memory cell is narrowly formed as compared with a case of performing a single program operation. Thus, threshold voltage distributions of different program states may be formed not to overlap each other.

Figure 5:
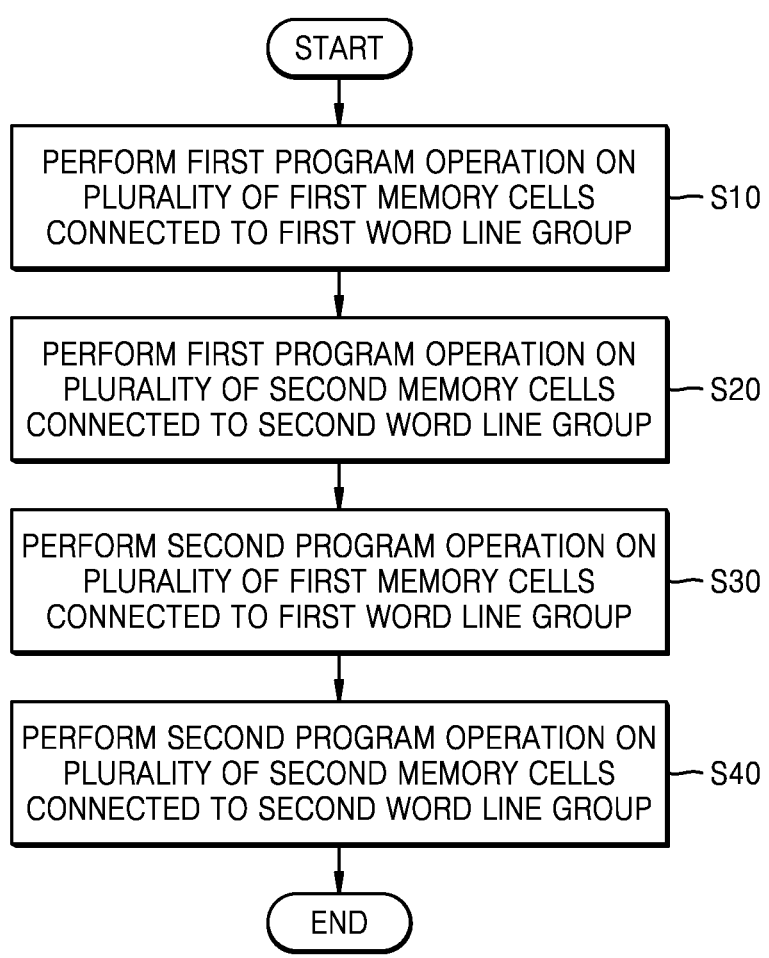
FIG. 5 is a flowchart of a method of programming a storage device according to some embodiments of the present inventive concept.

FIG. 5 is a flowchart of a method of programming a storage device according to some embodiments.

Referring to FIG. 5, the first program operation 1st PGM may be performed on the plurality of first memory cells connected to the first word line group (S10). For example, the first word line group may include at least some of the first through $m^{th}$ word lines WL_1 through WL_m included in the same memory block in FIG. 3. As the first program operation 1st PGM is performed, the threshold voltage distribution of the plurality of first memory cells may be changed as described with reference to FIG. 4.

Next, the first program operation 1st PGM may be performed on a plurality of second memory cells connected to the second word line group (S20). For example, the second word line group may include at least some of the first through $m^{th}$ word lines WL_1 through WL_m, and may not include any of the first through $m^{th}$ word lines WL_1 through WL_m included in the first word line group. In some embodiments, the second word line group may include first through $m^{th}$ word lines WL_1 through WL_m included in the memory block other than the first word line group. Thus, the plurality of first memory cells and the plurality of second memory cells may be different memory cells MC. In operation S20, the first program operation 1st PGM may be performed on the plurality of second memory cells. Thereafter, since the second program operation 2nd PGM is performed on the plurality of first memory cells, a state in which the first data DATA1 is written into the write buffer memory 130 may be maintained in operation S20.

Next, the second program operation 2nd PGM may be performed on the plurality of first memory cells connected to the first word line group (S30). A width of the threshold voltage distribution of the plurality of first memory cells formed by the first program operation 1st PGM may be further reduced by the second program operation 2nd PGM. When storing the first data DATA1 in the plurality of first memory cells is completed, the first data DATA1 in the write buffer memory 130 may be erased.

Next, the second program operation 2nd PGM may be performed on the plurality of second memory cells connected to the second word line group (S40). A width of the threshold voltage distribution of the plurality of second memory cells formed by the first program operation 1st PGM may be further reduced by the second program operation 2nd PGM.

A method of programming a storage device according to the inventive concept may perform the second program operation 2nd PGM on the plurality of second memory cells, not the plurality of first memory cells (S20), between the first program operation 1st PGM on the plurality of first memory cells (S10) and the second program operation 2nd PGM on the plurality of first memory cells (S30), thereby obtaining the delay time between the first and second program operations 1st and 2nd PGM on the plurality of first memory cells. The delay time between the first and second program operations 1st and 2nd PGM may be obtained by performing the second program operation 2nd PGM on the first memory cells (S30) between the first program operation 1st PGM on the second memory cells (S20) and the second program operation 2nd PGM on the second memory cells (S40).

In addition, some embodiments of a method of programming a storage device according to the inventive concept may obtain a delay time longer than the case in which the first program operation 1st PGM on the memory cells MC connected to one of the word lines is performed and the first program operation 1st PGM on the memory cells MC connected to another of the word lines is performed, and thereafter, the second program operation 2nd PGM on the memory cells MC connected to the one of the word lines is performed again.

Figure 6A:
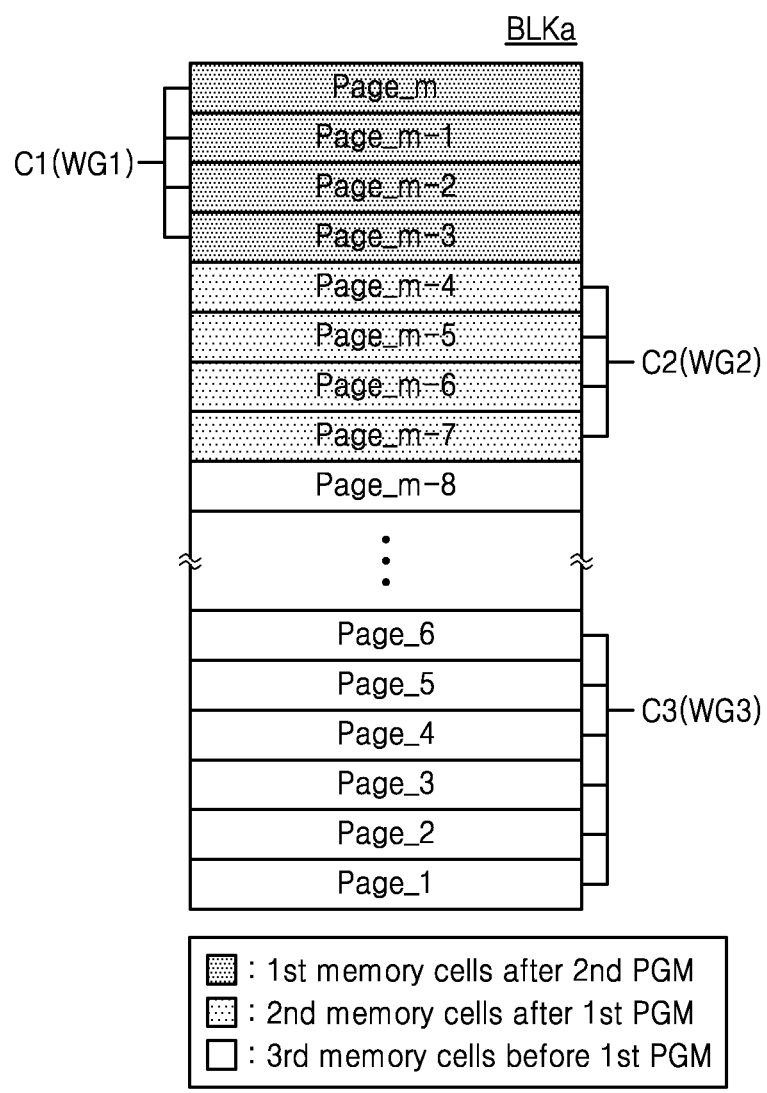
FIGS. 6A through 6C are diagrams for explaining operation S30 in FIG. 5; that is, for explaining a plurality of first memory cells and a plurality of second memory cells according to some embodiments of the present inventive concept.
Figure 6B:
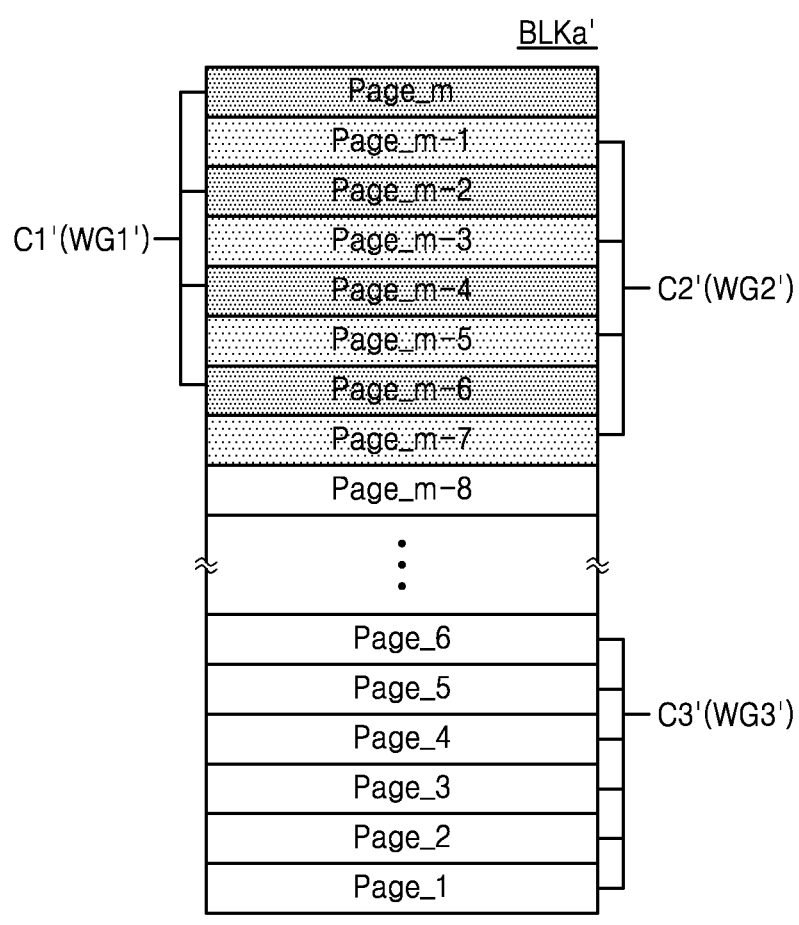
Figure 6C:
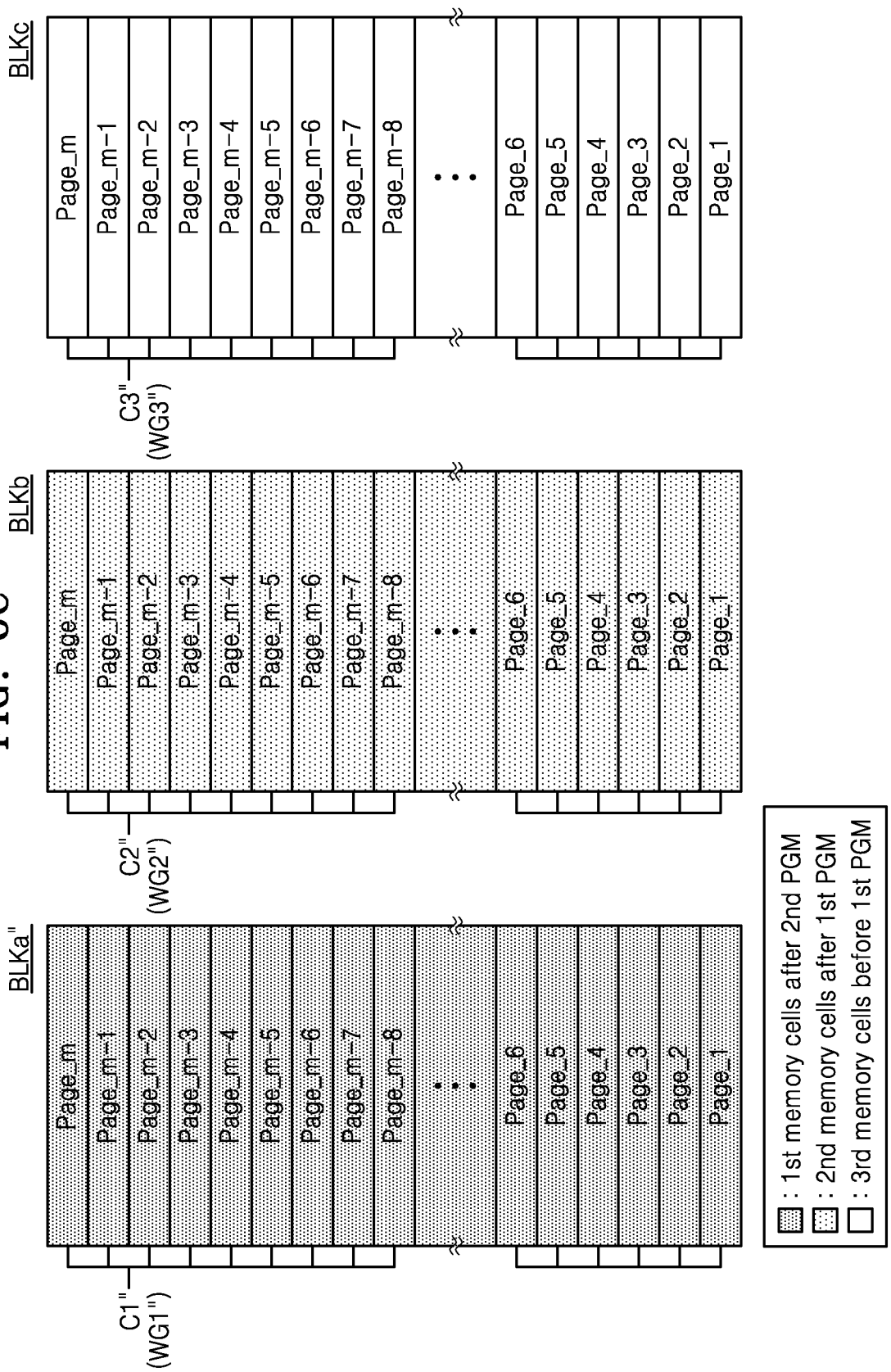

FIGS. 6A through 6C are diagrams for explaining operation S30 in FIG. 5; that is, for explaining the plurality of first memory cells and the plurality of second memory cells according to some embodiments.

Referring to FIGS. 3 and 6A, a first word line group WG1 may include $m^{th}$ through $(m-3)^{th}$ word lines WLm through WLm-3, and a second word line group WG2 may include $(m-4)^{th}$ through $(m-7)^{th}$ word lines WLm-4 through WLm-7. In some embodiments, the word lines included in the first word line group WG1 may be word lines adjacent to each other, and the second word line group WG2 may include word lines adjacent to each other.

A plurality of first memory cells C1 connected to the first word line group WG1 may constitute $m^{th}$ page through $(m-3)^{th}$ page Page_m through Page_m-3, and the first and second program operations 1st and 2nd PGM may be performed in a page unit. A plurality of second memory cells C2 connected to the second word line group WG2 may constitute $(m-4)^{th}$ page through $(m-7)^{th}$ Page_m-4 through page Page_m-7, and the first and second program operations 1st and 2nd PGM may be performed in page units.

Although each of the first word line group WG1 and the second word line group WG2 is explained as including four word lines, the embodiment is not limited thereto, and the numbers of the word lines included respectively in the first word line group WG1 and the second word line group WG2 may vary. In addition, although the plurality of first memory cells C1 and the plurality of second memory cells C2 are illustrated as being included in a first memory block BLKa included in the memory cell array 121, the plurality of first memory cells C1 and the plurality of second memory cells C2 may be included in different memory blocks.

Referring to FIGS. 3 and 6B, the first word line group WG1' may include the $m^{th}$, the $(m-2)^{th}$, $(m-4)^{th}$, and $(m-6)^{th}$ word lines WLm, WLm-2, WLm-4, and WLm-6, and the second word line group WG2' may include the $(m-1)^{th}$, the $(m-3)^{th}$, the $(m-5)^{th}$, and $(m-7)^{th}$ word lines WLm-1, WLm-3, WLm-5, and WLm-7. In some embodiments, the word lines included in the first word line group WG1' may not be adjacent to each other, but may be adjacent to the word lines included in another word line group. The word lines included in the second word line group WG2' may not be adjacent to each other, but may be adjacent to the word lines included in another word line group.

A plurality of first memory cells C1' connected to the first word line group WG1' may constitute the $m^{th}$, the $(m-2)^{th}$, $(m-4)^{th}$, and $(m-6)^{th}$ pages Page_m, Page_m-2, Page_m-4, and Page_m-6, and the first program operation and the second program operations 1st and 2nd PGM may be performed on a page unit. A plurality of second memory cells C2' connected to the second word line group WG2' may the $(m-1)^{th}$, the $(m-3)^{th}$, the $(m-5)^{th}$, and $(m-7)^{th}$ pages Page_m-1, Page_m-3, Page_m-5, and Page_m-7, and the first program operation and the second program operations 1st and 2nd PGM may be performed on a page basis.

Although each of the first word line group WG1' and the second word line group WG2' is explained as including four word lines, the embodiment is not limited thereto, and the numbers of word lines included respectively in the first word line group WG1' and the second word line group WG2' may vary. In addition, although the plurality of first memory cells C1' and the plurality of second memory cells C2' are illustrated as being included in a first memory block BLKa' included in the memory cell array 121, the plurality of first memory cells C1' and the plurality of second memory cells C2' may be included in different memory blocks.

Referring to FIG. 3 and FIG. 6C, a first word line group WG1" may include the first through $m^{th}$ word lines WL1 through WLm connected to a first memory block BLKa". A second word line group WG2" may include first through $m^{th}$ word lines WL1 through WLm connected to a second memory block BLKb.

A plurality of first memory cells C1" connected to the first word line group WG1" may constitute the first memory block BLKa", and the first and second program operations 1st and 2nd PGM may be performed in a page unit. A plurality of first memory cells C2' connected to the second word line group WG2" may constitute the second memory block BLKb, and the first and second program operations 1st and 2nd PGM may be performed in a page unit.

Referring to FIGS. 6A through 6C, a method of programming a storage device according to the inventive concept may be configured such that the first and second program operations 1st and 2nd PGM are performed on a plurality of first memory cells (C1, C1', and C1") in a sequence (that is, in a page unit) of word lines included in first word line groups (WG1, WG1', and WG1"). The first and second program operations may be performed on a plurality of second memory cells (C2, C2', and C2") in a sequence (that is, in a page unit) of word lines included in second word line groups (WG2, WG2', and WG2"). Since the second program operation 2nd PGM is performed on the plurality of first memory cells (C1, C1', and C1") in a sequence of word lines included in first word line groups (WG1, WG1', and WG1") after the first program operation 1st PGM on the plurality of second memory cells (C2, C2', and C2") is completed, the delay time between executions of the first program operation 1st PGM and the second program operation 2nd PGM may be extended.

The method of programming a storage device according to the inventive concept is not limited those illustrated in FIGS. 6A through 6C. The first program operation 1st PGM may be performed on at least some of a plurality of third memory cells (C3, C3', and C3") before the second program operation 2nd PGM is performed on the first memory cells (C1, C1', and C1") (for example, operation S30 in FIG. 5). In some embodiments, the first program operation 1st PGM may be performed on at least some of the plurality of third memory cells (C3, C3', and C3") before the second program operation 2nd PGM is performed on the second memory cells (C2, C2', and C2") (for example, operation S40 in FIG. 5).

Thus, after a plurality of first memory cells and a plurality of second memory cells are programmed, an overlapping phenomenon of threshold voltage distributions between different program states may be prevented.

Figure 7:
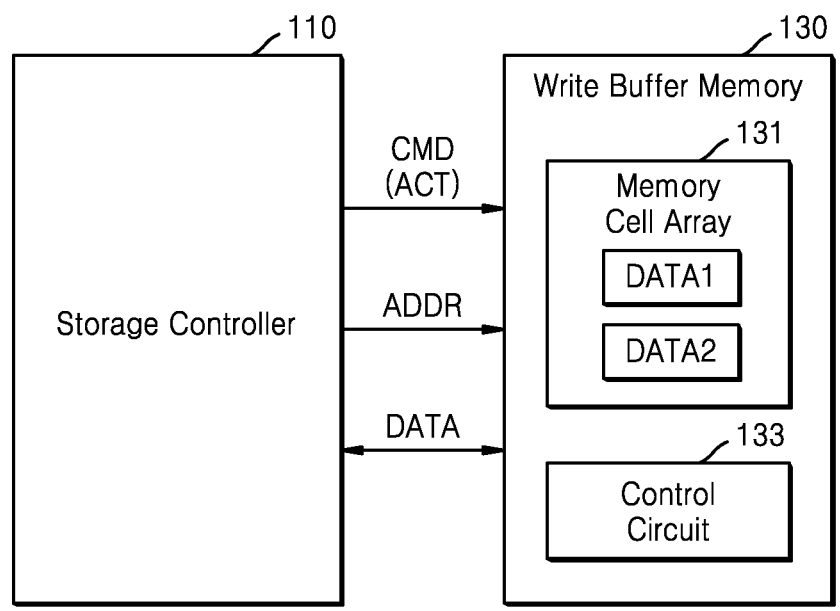
FIG. 7 is a block diagram illustrating a write buffer memory included in a storage device according to some embodiments of the present inventive concept.

FIG. 7 is a block diagram illustrating the write buffer memory 130 included in a storage device according to some embodiments. In FIG. 7, the write buffer memory 130 is described as being implemented with the resistive memory for convenience of explanation, but the inventive concept is not limited thereto.

Referring to FIG. 7, the write buffer memory 130 may include a memory cell array 131 and a control circuit 133. The write buffer memory 130 may further include a row decoder for decoding a row address to select a word line, a column decoder for decoding a column address to set a selected column switch to an on state, a sense amplifier, a read data latch, a write driver, and a write data latch. The memory cell array 131 may include a plurality of banks, and each of the plurality of banks may be connected to row decoders, column decoders, sense amplifiers, read data latches, write drivers, and write data latches, which may be individually different from each other.

The memory cell array 131 may include the plurality of memory cells MC. The plurality of memory cells MC may be arranged at intersections of the plurality of bit lines and the plurality of word lines. In some embodiments, each memory cell MC may be an SLC storing data of one bit. For example, the memory cell MC may have two resistance distributions depending on data stored therein. However, the write buffer memory 130 according to the inventive concept is not limited thereto, and each memory cell MC may be a multi-level cell capable of storing data of 2 bits, or a triple level cell capable of storing data of 3 bits. In this case, each of the memory cells MC may have four or eight resistance distributions depending on data stored therein. However, the inventive concept is not limited thereto, and the memory cell array 131 may include memory cells MC each capable of storing data of 4 bits or more. In addition, the memory cell array 131 may include an SLC together with a multi-level cell and/or a triple level cell.

In some embodiments, the plurality of memory cells MC may include resistance-based memory cells including variable resistance elements having a resistance that varies depending on data to be stored therein, or may include resistive memory cells. In some embodiments, when the variable resistance element has a resistance varying with temperature as a phase change material (that is, germanium-antimony-tellurium (Ge—Sb—Te or GST)), the write buffer memory 130 may be PRAM. As another example, when the variable resistance element includes complex metal oxide arranged on a top electrode, a bottom electrode, and therebetween, the buffer memory 130 may be RRAM. As another example, in some embodiments, when the write buffer memory 130 includes a top electrode of a magnetic substance, a bottom electrode of a magnetic substance, and a dielectric material therebetween, the write buffer memory 130 may be MRAM.

The storage controller 110 may control the write buffer memory 130 to read data DATA after temporarily storing the data DATA in response to the write request from the host 200. The storage controller 110 may control the write operation or the read operation of the write buffer memory 130 by providing a command CMD and the address ADDR to the write buffer memory 130. In addition, data DATA to be written and read data may be transmitted and received between the storage controller 110 and the write buffer memory 130.

The control circuit 133 may control the write and read operations to/from the memory cell array 131 in response to the command CMD received from the storage controller 110. The control circuit 133 may control a bank active state of the memory cell array 131 based on the address ADDR including a bank address and/or the row address received together with an active command ACT. The control circuit 133 may enable circuits related with the bank to be activated in response to the bank address in the bank active state, activate a selected word line by decoding the row address in the activated bank, and perform a read data identification operation of reading and latching data of the memory cells MC of the memory cell array 131 connected to the selected word line.

The control circuit 133 may perform the read operation in response to a read command CMD. The control circuit 133 may output to the storage controller 110 the data read from the memory cell array 131 in the bank active state as output data DATA. The control circuit 133 may perform the read operation in response to the read command CMD. The control circuit 133 may write the received data DATA to the memory cell array 131 in the bank active state.

The write buffer memory 130 according to the inventive concept may write first data DATA1 and second data DATA2 into the memory cell array 131 in the bank active state according to the write command CMD, and may read the first data DATA1 and the second data DATA2 according to the read command CMD.

Figure 8:
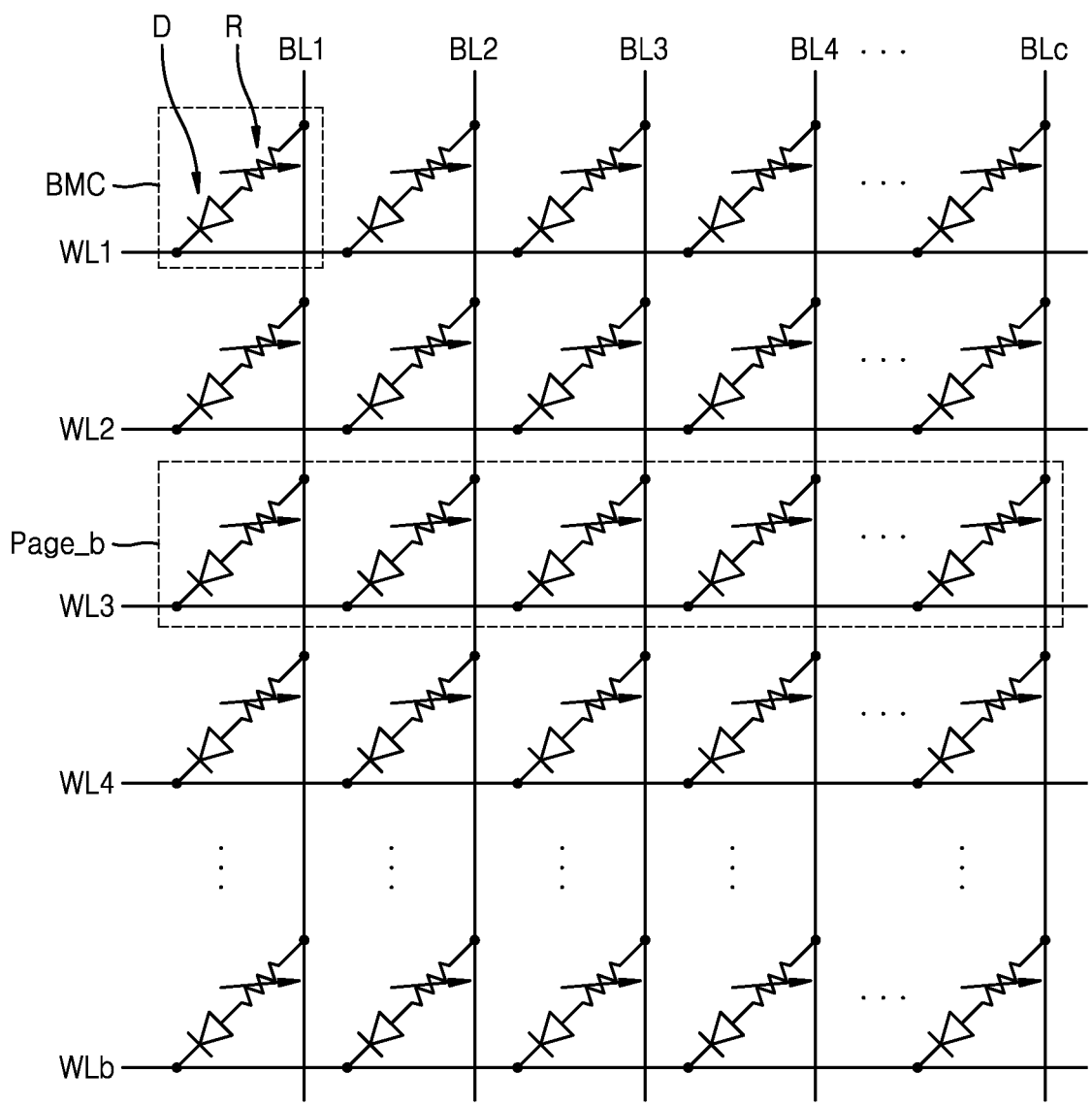
FIG. 8 is a circuit diagram schematically illustrating a memory cell array in FIG. 7 according to some embodiments of the present inventive concept.

FIG. 8 is a circuit diagram schematically illustrating the memory cell array 131 in FIG. 7.

Referring to FIG. 8, the memory cell array 131 may be a two-dimensional memory of a horizontal structure and include the first through $b^{th}$ word lines WL1 through WLb, the first through $c^{th}$ bit lines BL1 through BLc, and a plurality of memory cells BMC. In this case, a and b may be integers of 5 or more, and the number of word lines WL, the number of bit lines BL, and the number of memory cells BMC may be variously changed according to some embodiments. Unlike as illustrated in FIG. 8, the memory cell array 131 may be a vertical three-dimensional memory. The memory cell array 131 may include the plurality of memory blocks. In FIG. 8, only one memory block is illustrated for convenience of explanation. The memory block may include a plurality of pages Page_b. Each of the plurality of pages Page_b may correspond to the write unit or the read unit of data in one memory block. Each of the plurality of pages Page_b may be connected to one of the first through $b^{th}$ word lines WL1 through WLb.

In some embodiments, each of the plurality of memory cells BMC may be a one diode-one resistor (1D1R) type memory cell including a variable resistance element R and a selection element D. Here, the variable resistance element R may be referred to as a variable resistance material, and the selection element D may be referred to as a switching element.

In some embodiments, the variable resistance element R may be connected between one of the first through $c^{th}$ bit lines BL1 through BLc and the selection element D, and the selection element D may be connected between the variable resistance element R and one of the first through $b^{th}$ word lines WL1 through WLb. However, the embodiment is not limited thereto, and the selection element D may be connected between one of the first through $c^{th}$ bit lines BL1 through BLc and the variable resistance element R, and the variable resistance element R may be connected to the selection element D and one of the first through $b^{th}$ word lines WL1 through WLb.

The variable resistor R may have one of a plurality of resistance states due to an applied electrical pulse. In some embodiments, the variable resistance element R may include a phase-change material in which a crystal state changes according to an amount of current. The phase change material may include various kinds of materials such as GaSb, InSb, InSe, Sb2Te3, and/or GeTe each combining 2 elements, GeSbTe, GaSeTe, InSbTe, SnSb2Te4, and/or InSbGe each combining 3 elements, and/or AgInSbTe, (GeSn)SbTe, GeSb(SeTe), and/or Te81Ge15Sb2S2 each combining 4 elements.

In some examples, the variable resistance element R may include, instead of the phase change material, perovskite compounds, transition metal oxide, magnetic materials, ferromagnetic materials, or anti-ferromagnetic materials.

The selection element D may be connected between any one of the first through $b^{th}$ word lines WL1 through WLb and the variable resistance elements R corresponding thereto, and may control a current supply to the variable resistance element R according to a voltage applied to the connected word line WL and connected bit line BL. In FIG. 8, the selection element D is illustrated as a diode, but this is only an example embodiment of the inventive concept, and in some embodiments, the selection element D may be changed to another switchable element.

Figure 9A:
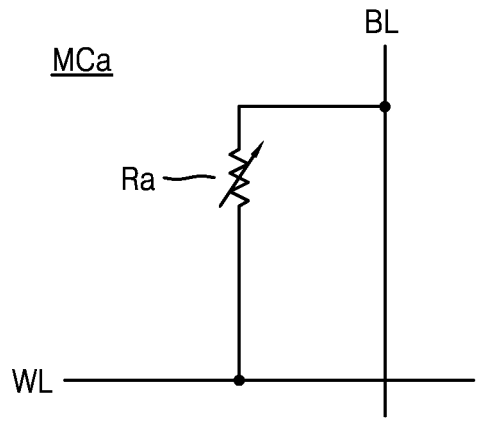
FIGS. 9A through 9C are circuit diagrams illustrating different embodiments of a plurality of memory cells in FIG. 8 according to some embodiments of the present inventive concept.
Figure 9B:
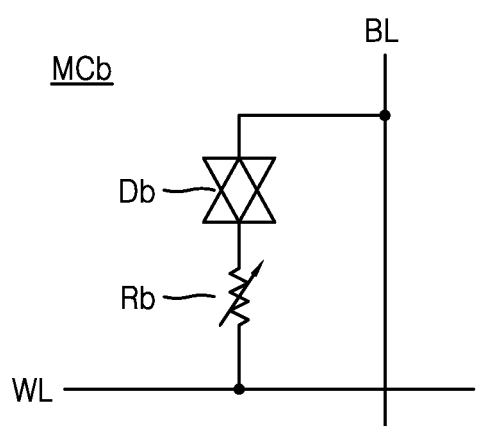
Figure 9C:
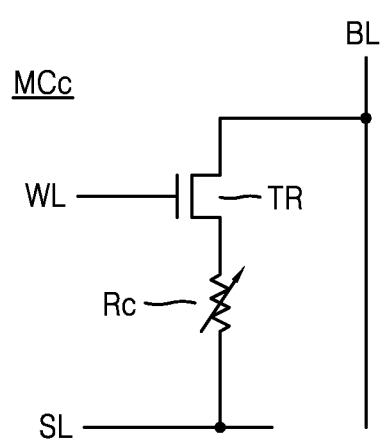

FIGS. 9A through 9C are circuit diagrams illustrating different embodiments of the plurality of memory cells BMC in FIG. 8.

Referring to FIG. 9A, a memory cell MCa may include a variable resistance element Ra, and the variable resistance element Ra may be connected between the bit line BL and the word line WL. The memory cell MCa may store data by voltages respectively applied to the bit line BL and the word line WL.

Referring to FIG. 9B, a memory cell MCb may include a variable resistance element Rb and a bi-directional diode Db. The variable resistance element Rb may include a resistance material for storing data. The bi-directional diode Db may be connected between the variable resistance element Rb and the bit line BL, and the variable resistance element Rb may be connected between the word line WL and the bi-directional diode Db. Positions of the bi-directional diode Db and the variable resistance element Rb may be reversed. A leakage current flowing through the bi-directional diode Db to an unselected resistance cell may be cut off.

Referring to FIG. 9C, a memory cell MCc may include a variable resistance element Rc and a transistor TR. The transistor TR may be a selection element, that is, a switching element, which supplies or cuts off the current to the variable resistor Rc according to the voltage of the word line WL. In the embodiment of FIG. 9C, a source line SL for adjusting voltage levels of both ends of the variable resistance element Rc may be additionally provided. The transistor TR may be connected between the variable resistance element Rc and the bit line BL, and the variable resistance element R may be connected between the source line SL and the transistor TR. The source line SL may be a ground voltage line. Positions of the transistor TR and the variable resistance element Rc may be switched from each other. The memory cell MCc may be selected or unselected depending on whether the transistor TR driven by the word line WL is on or off.

Figure 10:
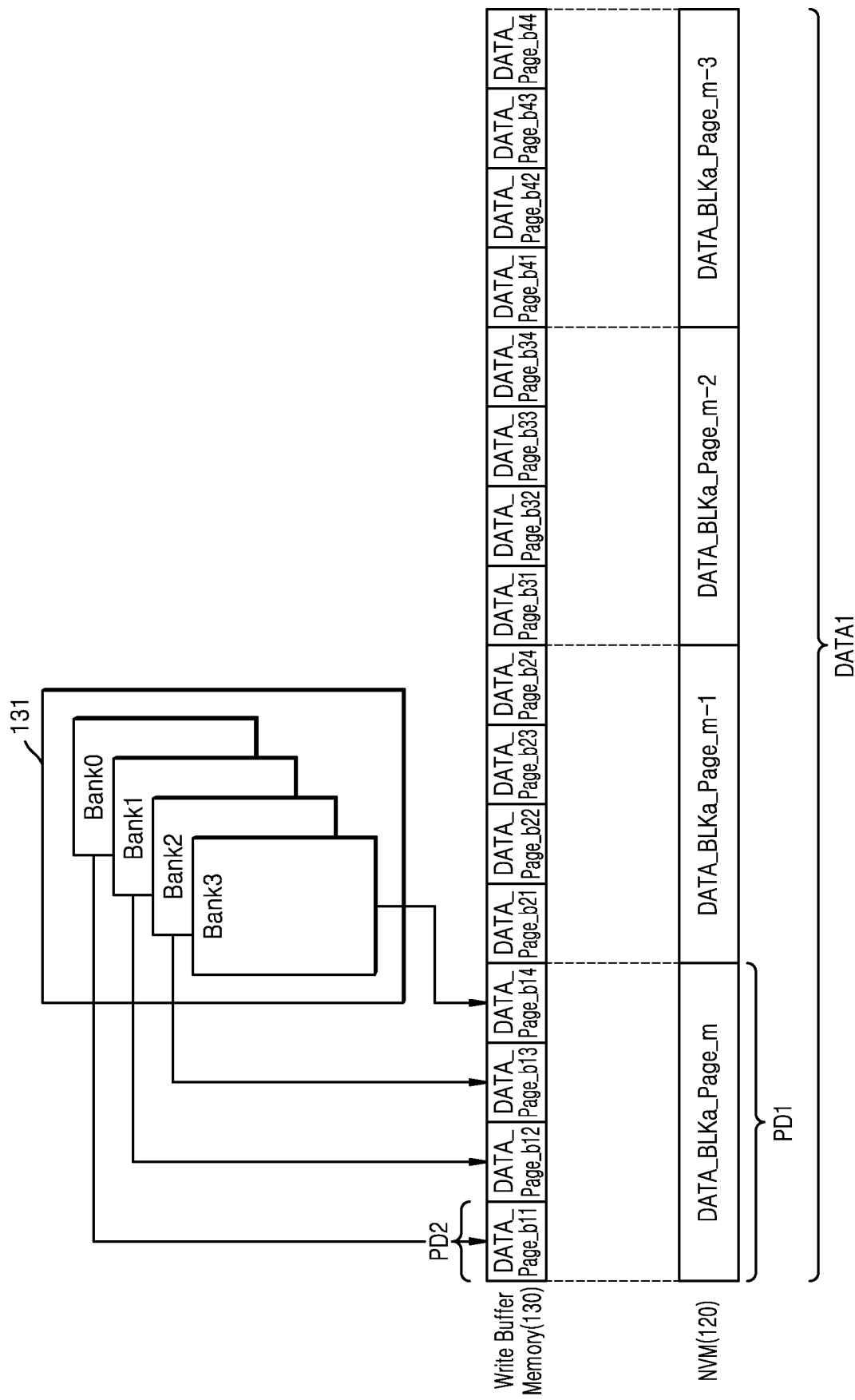
FIG. 10 is a diagram for explaining an operation of a write buffer memory according to some embodiments of the present inventive concept.

FIG. 10 is a diagram for explaining the write operation of the write buffer memory 130 according to some embodiments. As illustrated in FIG. 6A, a case is explained in which the first data DATA1 is stored into the $m^{th}$ through $(m-3)^{th}$ pages Page_m through Page_m-3 of the first memory block BLKa of the NVM 120.

Referring to FIGS. 6A and 10, a capacity of a first page data PD1 stored in one page of the NVM 120 may be greater than that of a second page data PD2 stored in one page of the write buffer memory 130. In FIG. 10, the first page data PD1 is illustrated to be four times the second page data PD2, but this is for convenience of understanding, and embodiments are not limited thereto.

When the first data DATA1 is written into the NVM 120, the first data DATA1 may be sequentially written into the $m^{th}$ through $(m-3)^{th}$ pages Page_m through Page_m-3 in a page unit. In other words, the first program operation 1st PGM or the second program operation 2nd PGM may be sequentially performed on the $m^{th}$ through $(m-3)^{th}$ word lines WLm through WLm-3. Accordingly, the write buffer memory 130 may output the first data DATA1 in a manner that data respectively corresponding to the $m^{th}$ through $(m-3)^{th}$ pages Page_m through Page_m-3 of the first memory block BLKa of the NVM 120 is sequentially output. For example, the write buffer memory 130 may sequentially output data (DATA_Page_b11, DATA_Page_b12, DATA_Page_b13, and DATA_Page_b14) that is stored in each of the plurality of pages of the write buffer memory 130 so that the write buffer memory 130 outputs data DATA_BLKa_Page_m corresponding to the $m^{th}$ page Page_m of the first memory block BLK1 of the NVM 120. In addition, the write buffer memory 130 may sequentially output data (DATA_Page_b21, DATA_Page_b22, DATA_Page_b23, and DATA_Page_b24) that is stored in each of the plurality of pages of the write buffer memory 130 so that the write buffer memory 130 outputs data DATA_BLKa_Page_m-1 corresponding to the $(m-1)^{th}$ page Page_m-1 of the first memory block BLK1 of the NVM 120.

The memory cell array 131 of the write buffer memory 130 may include zeroth through third banks Bank0 through Bank3, and although four banks are illustrated in FIG. 10, the inventive concept is not limited thereto. In some embodiments, the data (DATA_Page_b11, DATA_Page_b12, DATA_Page_b13, and DATA_Page_b14) stored in each of the plurality of pages of the write buffer memory 130 may be data respectively stored in different banks.

In a mapping table (for example, the mapping table 113 in FIG. 1B), information about a logical address of each of the plurality of pages of the NVM 120 and information about a physical address of each of the plurality of pages of the write buffer memory 130 corresponding to the logical address may be stored. For example, information about the physical address of each of the plurality of pages (Page_b11, Page_b12, Page_b13, and Page_b14) of the write buffer memory 130 corresponding to the logical address of the $m^{th}$ page Page_m of the first memory block BLKa of the NVM 120 may be stored. Accordingly, when a request is received from the host 200 to write data into the $m^{th}$ page Page_m of the first memory block BLKa of the NVM 120, in the write buffer memory 130, data may be temporarily written into the plurality of pages (for example, Page_b11, Page_b12, Page_b13, and Page_b14) of the first memory block BLKa based on the mapping table 113, and thereafter, data may be written into the $m^{th}$ page Page_m of the first memory block BLKa.

Figure 11A:
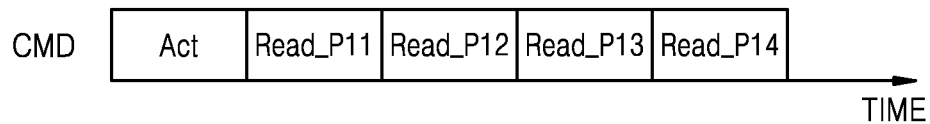
FIGS. 11A and 11B are timing diagrams of a write operation of a write buffer memory according to some example embodiments of the present inventive concept.
Figure 11B:
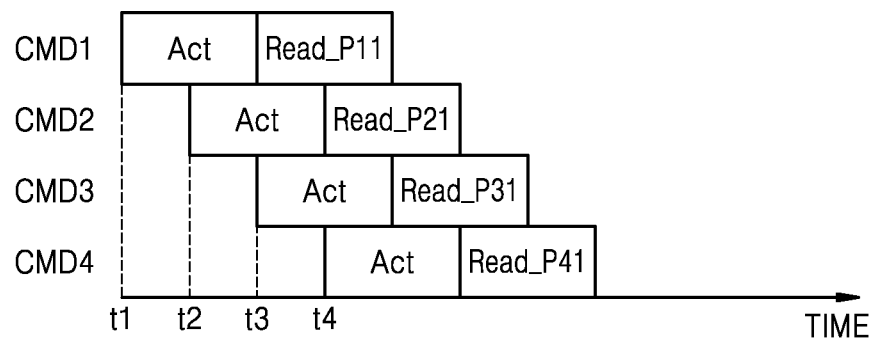

FIGS. 11A and 11B are timing diagrams of the write operation of the write buffer memory 130 according to example embodiments. Descriptions will be given based on what have been illustrated in FIG. 10 and described with reference to FIG. 10.

Referring to FIGS. 7, 10, and 11A, in some embodiments, the write buffer memory 130 may be a resistive memory device. The read operation of the write buffer memory 130 may be performed by the active command Act and a plurality of read commands (Read_P11, Read_P12, Read_P13, and Read_P14) that are continuously received.

Each of the plurality of read commands (Read_P11, Read_P12, Read_P13, and Read_P14) may be a command to read data stored in the plurality of pages (Page_b11, Page_b12, Page_b13, and Page_b14) of the write buffer memory 130 in FIG. 10. At this time, since the data stored in the plurality of pages (Page_b11, Page_b12, Page_b13, and Page_b14) is one page of the NVM 120 (for example, the data DATA_BLKa_Page_m to be stored in the $m^{th}$ page Page_m of the first memory block BLKa), data stored in the plurality of pages (Page_b11, Page_b12, Page_b13, and Page_b14) of the write buffer memory 130 may be read entirely without a need to be partially read. Accordingly, when the storage controller 110 outputs each of the plurality of read commands (Read_P11, Read_P12, Read_P13, and Read_P14) to the write buffer memory 130, the active command ACT may not be separately output between the read commands (Read_P11, Read_P12, Read_P13, and Read_P14). The storage controller 110 may sequentially output the plurality of read commands (Read_P11, Read_P12, Read_P13, and Read_P14) after outputting the active command Act to the write buffer memory 130. The write buffer memory 130 may be in an active state by the active command Act and may read data based on the respective addresses corresponding to the plurality of read commands (Read_P11, Read_P12, Read_P13, and Read_P14). Accordingly, the write buffer memory 130 according to example embodiments of the inventive concept may output data to be stored in one page of the NVM 120 without being provided with the active command ACT for a plurality of times, and thus a data read speed thereof may increase.

Referring to FIGS. 7, 10 and 11B, the read operation of the write buffer memory 130 may be performed by a plurality of active commands Act and the plurality of read commands (Read_P11, Read_P12, Read_P13, and Read_P14) provided at different times (t1, t2, t3, and t4). Addresses ADDR respectively corresponding to the plurality of read commands (Read_P11, Read_P12, Read_P13, and Read_P14) may denote pages included in different banks of the memory cell array 131 of the write buffer memory 130. Time durations in which active operations for reading data stored in the pages included in the different banks are performed may overlap each other, and the read operations may be performed in superposition with each other. In other words, a total time for reading the data DATA_BLKa_Page_m_may be shortened through a bank interleaving operation and thus, the data read speed may increase.

Figure 12:
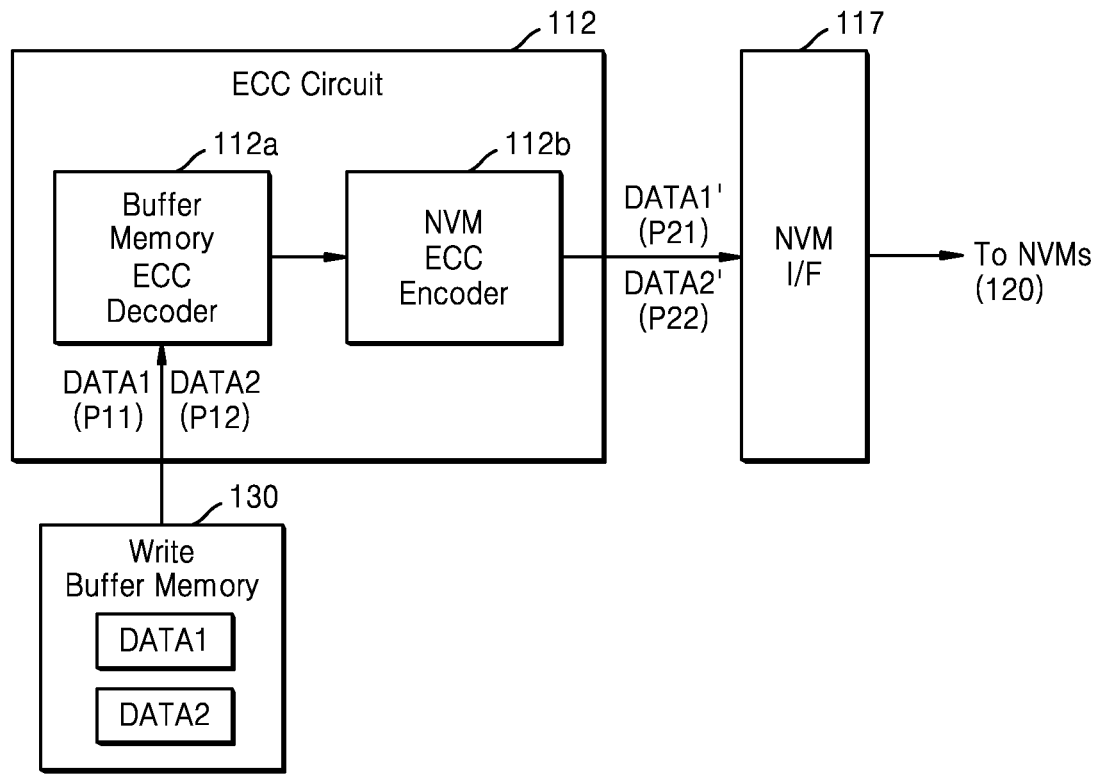
FIG. 12 is a block diagram illustrating a configuration of an error checking and correcting (ECC) circuit included in a storage device according to some embodiments of the present inventive concept.

FIG. 12 is a block diagram illustrating a configuration of an ECC circuit included in a storage device according to some embodiments, and is a block diagram of the ECC circuit 112 in FIG. 1B.

Referring to FIG. 12, the ECC circuit 112 may include a buffer memory ECC decoder 112a and an NVM ECC encoder 112b.

The buffer memory ECC decoder 112a may sequentially receive the first data DATA1 and the second data DATA2 from the write buffer memory 130. At this time, the first data DATA1 may include a first ECC parity code P11 generated based on the first data DATA1, and the second data DATA2 may include a first ECC parity code P12 generated based on the second data DATA2. The buffer memory ECC decoder 112a may detect errors contained in each of the first data DATA1 and the second data DATA2 by decoding each of first ECC parity codes (P11 and P12). The first ECC parity codes (P11 and P12) may be used for correcting the errors generated in the first data DATA1 and the second data DATA2. For example, errors occurring in one or more bits of data in a read process of the first data DATA1 and the second data DATA2 may be corrected through an error correction operation by using the first ECC parity codes (P11, P12).

The NVM ECC encoder 112b may generate the second parity code P21 by ECC encoding the error-corrected first data DATA1 and generate the second parity code P22 by ECC encoding the error-corrected second data DATA2. The NVM ECC encoder 112b may output to the NVM I/F 117 first data DATA1' including the second parity code P21 and second data DATA2' including the second parity code P22.

At this time, the first data DATA1' and the second data DATA2' provided to the NVM 120 may be data in which errors of the first data DATA1 and the second data DATA2 have been corrected. Each of the first ECC parity codes (P11 and P12) may be different from each of the second ECC parity codes (P21 and P22).

In some embodiments, the NVM 120 may be a NAND flash memory, and the write buffer memory 130 may be a PRAM. Time taken by the buffer memory ECC decoder 112*a* to decode when the write buffer memory 130 is a PRAM may be reduced as compared with the case where the write buffer memory 130 is a NAND flash memory.

Figure 13:
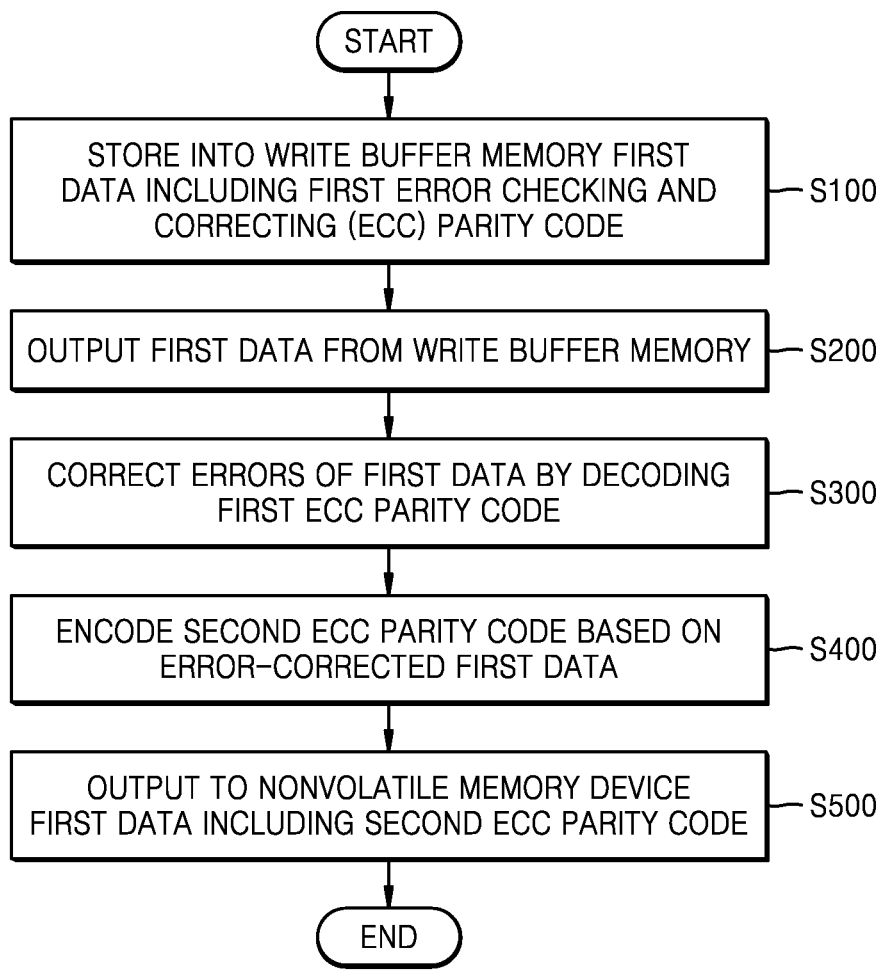
FIG. 13 is a flowchart of an operation of a storage controller included in a storage device according to some embodiments of the present inventive concept.

FIG. 13 is a flowchart of operations of a storage controller included in a storage device according to example embodiments.

Referring to FIGS. 1B, 12 and 13, the first data DATA1, to be stored in the plurality of first memory cells including the first ECC parity code (P11) generated based on the first data DATA1, may be stored in the write buffer memory 130 (S100). At this time, the second data DATA2 to be stored in the plurality of second memory cells including the first ECC parity code (P12) generated based on the second data DATA2 may be stored together with the first data DATA1 in the write buffer memory 130.

The first data DATA1 may be output from the write buffer memory 130 (S200).

The buffer memory ECC decoder 112*a* may decode the first ECC parity code (P11) and correct an error of the first data DATA1 (S300). The buffer memory ECC decoder 112*a* may output the error-corrected first data DATA1.

The NVM ECC encoder 112*b* may receive the error-corrected first data DATA1 and encode the second ECC parity code (P21) based on the error-corrected first data DATA1.

The NVM ECC encoder 112*b* may output the first data DATA1' including the second ECC parity code (P21) to the NVM 120 via the NVM I/F 117 (S500).

After operation S500 is performed, operations on the second data DATA2 stored in the write buffer memory 130 may be performed. For example, the second data DATA2 including the first ECC parity code (P12) may be output from the write buffer memory 130, and an error of the second data DATA2 may be corrected through decoding of the first ECC parity code (P12). The NVM ECC encoder 112*b* may receive the error-corrected second data DATA2 and encode the second ECC parity code (P22) based on the error-corrected second data DATA2. The NVM ECC encoder 112*b* may output the second data DATA2' including the second ECC parity code (P22) to the NVM 120 via the NVM I/F 117.

When a write buffer memory is implemented as a NAND flash memory including an SLC and is included in an NVM, the first data and the second data are input into the write buffer memory (once), a first ECC parity code is decoded and a second ECC parity code is encoded based on the first data and the second data output from the write buffer memory (twice) and the first data and the second data including in the first ECC parity code are written into the NVM 120 (thrice). Since the first data and the second data are input and output three times between a storage controller (for example, 110 in FIG. 1) and the NVM 120, a certain amount of time may be required for data input/output operations.

However, a storage device according to the inventive concept may include the write buffer memory 130 separately provided from the NVM 120 so that each of the first data DATA1' and the second data DATA2' is output once between the storage controller 110 and the NVM 120. Thus, time to be required for writing the first data DATA1' and the second data DATA2' into the NVM 120 may be reduced.

Embodiments of the inventive concept have been described in detail with reference to the accompanying drawings. On the other hand, while the detailed description of the present disclosure has been provided with reference to specific embodiments, various modifications may be made without departing from the scope of the present disclosure. Therefore, the scope of the present disclosure should not be construed as being limited to the above-described embodiments, and may be defined by equivalents to the claims of the present disclosure as well as the following claims.

What is claimed is:

1. A storage device comprising:
    a nonvolatile memory comprising a plurality of nonvolatile memory cells;
    a write buffer memory configured to store first data and second data received from a host; and
    a storage controller configured to store the first data and the second data that are stored in the write buffer memory into the nonvolatile memory,
    wherein the storage controller is configured to perform a first program operation and a second program operation on a plurality of first memory cells connected to a first word line group comprising a plurality of first word lines to store the first data,
    wherein the storage controller is configured to perform a first program operation and a second program operation on a plurality of second memory cells connected to a second word line group comprising a plurality of second word lines to store the second data, and
    wherein, while the storage controller is configured to perform the first program operation on the plurality of second memory cells, the first data is written in the write buffer memory.

2. The storage device of claim 1, wherein a plurality of word lines in the first word line group are adjacent to each other.

3. The storage device of claim 1,
    wherein at least one of the plurality of second word lines are between different first word lines among the plurality of first word lines.

4. The storage device of claim 1, wherein the plurality of first memory cells comprise a first memory block.

5. The storage device of claim 1, wherein the write buffer memory comprises a plurality of resistive memory cells.

6. The storage device of claim 1,
    wherein the storage controller is configured to subsequently provide the active command and a plurality of read commands corresponding to different addresses to the write buffer memory.

7. The storage device of claim 1,
    wherein the storage controller is configured to subsequently provide a plurality of active commands to the write buffer memory, and
    wherein time durations in which active operations on the write buffer memory due to the plurality of active commands are performed overlap each other.

8. The storage device of claim 1, wherein a first size of data stored in a single page of the nonvolatile memory is greater than a second size of data stored in a single page of the write buffer memory.

9. The storage device of claim 1,
    wherein the storage controller comprises an error checking and correcting (ECC) circuit comprising a buffer memory ECC decoder and a nonvolatile memory (NVM) ECC encoder,
    wherein the buffer memory ECC decoder is configured to detect errors by decoding a first ECC parity code in the first data and a second ECC parity code in the second data, and wherein the NVM ECC encoder is configured to encode the first ECC parity code of the first data and the second ECC parity code of the second data in which the errors have been corrected.

10. A storage device comprising:
a nonvolatile memory comprising a plurality of nonvolatile memory cells; and
a storage controller configured to store first data and second data received from a host into the nonvolatile memory, the storage controller comprising a write buffer memory,
wherein the storage controller is configured to perform a first program operation and a second program operation on a plurality of first memory cells connected to a first word line group to store the first data, and
wherein the storage controller is configured to perform a first program operation and a second program operation on a plurality of second memory cells connected to a second word line group to store the second data, and
wherein the first data written in the write buffer memory while the storage controller is configured to perform the first program operation on the plurality of second memory cells.

11. The storage device of claim 10, wherein a plurality of word lines in at least one word line group among the first word line group and the second word line group are adjacent to each other.

12. The storage device of claim 10, wherein at least one of second word lines in the second word line group are between first word lines in the first word line group.

13. The storage device of claim 10, wherein the plurality of first memory cells comprises a first memory block and the plurality of second memory cells comprises a second memory block that is different from the first memory block.

14. The storage device of claim 10, wherein the write buffer memory and the nonvolatile memory are mutually different memories.

15. The storage device of claim 14, wherein the write buffer memory is a phase change random access memory (PRAM).

16. The storage device of claim 10, wherein increments of a plurality of first program pulses in the first program operation are different from increments of a plurality of second program pulses in the second program operation.

17. The storage device of claim 10, wherein ones of the plurality of nonvolatile memory cells are configured to store multi-bit data.

18. A method of operating a storage device comprising a nonvolatile memory and a storage controller configured to control the nonvolatile memory, the method of operating the storage device comprising:
performing a first program operation on a plurality of first memory cells connected to a first word line group based on first data;
performing a first program operation on a plurality of second memory cells connected to a second word line group different from the first word line group based on second data;
performing a second program operation on the plurality of first memory cells based on the first data; and
performing a second program operation on the plurality of second memory cells based on the second data,
wherein ones of the plurality of first memory cells and ones of the plurality of second memory cells store multi-bit data, and
wherein the performing of the first program operation on the plurality of first memory cells, the performing of the first program operation on the plurality of second memory cells, the performing of the second program operation on the plurality of first memory cells, and the performing of the second program operation on the plurality of second memory cells are sequentially executed.

19. The method of operating the storage device of claim 18, further comprising:
decoding, by the storage controller, a first error checking and correcting (ECC) parity code in the first data;
correcting, by the storage controller, errors of the first data based on the decoding the first ECC parity code to produce error-corrected first data;
encoding, by the storage controller, a second ECC parity code based on the error-corrected first data; and
outputting, by the storage controller, the first data and the second ECC parity code to the nonvolatile memory.

20. The method of operating the storage device of claim 18, wherein ones of the plurality of first memory cells and ones of the plurality of second memory cells store data of 4 bits or more.

* * * * *